United States Patent [19]
Cox et al.

[11] Patent Number: 5,539,757
[45] Date of Patent: Jul. 23, 1996

[54] ERROR CORRECTION SYSTEMS WITH MODIFIED VITERBI DECODING

[75] Inventors: Richard V. Cox, New Providence; Reed Thorkildsen, Andover; Yong Zhou, Washington Township, Morris County, all of N.J.

[73] Assignee: AT&T Corp., Murray Hill, N.J.

[21] Appl. No.: 173,818

[22] Filed: Dec. 22, 1993

[51] Int. Cl.$^6$ ............................ G06F 11/10; H03M 13/12
[52] U.S. Cl. ............................................................ 371/43
[58] Field of Search ................................ 371/43, 44, 45, 371/37

[56] References Cited

U.S. PATENT DOCUMENTS

| | | | |
|---|---|---|---|
| 4,240,156 | 12/1980 | Doland | 371/43 |
| 4,631,735 | 12/1986 | Qureshi | 375/34 |
| 4,660,214 | 4/1987 | Pahlavan et al. | 375/39 |
| 4,777,636 | 10/1988 | Yamashita et al. | 371/43 |
| 5,111,483 | 5/1992 | Serfaty | 375/94 |
| 5,181,209 | 1/1993 | Hagenauer et al. | 371/43 |
| 5,193,094 | 3/1993 | Viterbi | 371/43 |
| 5,208,816 | 5/1993 | Seshardi | 371/43 |
| 5,229,767 | 7/1993 | Winter et al. | 341/50 |
| 5,243,605 | 9/1993 | Lekmine et al. | 371/43 |
| 5,257,272 | 10/1993 | Fredrickson | 371/43 |
| 5,280,489 | 1/1994 | Fredrickson et al. | 371/45 |
| 5,291,499 | 3/1994 | Behrens et al. | 371/43 |

*Primary Examiner*—Roy N. Envall, Jr.
*Assistant Examiner*—Emmanuel L. Moise

[57] ABSTRACT

In a communications system, a convolutional encoder encodes data from a data source and a modified Viterbi decoder decodes the encoded data after the encoded dated passes through an error producing channel. The decoder calculates selected metric increments, known as kernel metric increments, for half the states, and selects survivor metrics for all states.

4 Claims, 16 Drawing Sheets

FIG. 6

| INPUT x | OLD STATE $s_0$ $s_1$ $s_2$ $\cdots$ $s_{K-3}$ $s_{K-2}$ | j | NEW STATE $s'_0$ $s'_1$ $s'_2$ $\cdots$ $s'_{K-3}$ $s'_{K-2}$ | j' |
|---|---|---|---|---|
| 0<br>1 | 0 0 0     0 0 | 0 | 0 0 0     0 0<br>1 0 0     0 0 | 0<br>1 |
| 0<br>1 | 1 0 0     0 0 | 1 | 0 1 0     0 0<br>1 1 0     0 0 | 2<br>3 |
| 0<br>1 | 0 1 0     0 0 | 2 | 0 0 1     0 0<br>1 0 1     0 0 | 4<br>5 |
| $\vdots$ | $\vdots$ | $\vdots$ | $\vdots$ | $\vdots$ |
| 0<br>1 | 0 1 1     1 0 | N/2−2 | 0 0 1     1 1<br>1 0 1     1 1 | N−3<br>N−2 |
| 0<br>1 | 1 1 1     1 0 | N/2−1 | 0 1 1     1 1<br>1 1 1     1 1 | N−1<br>N |
| 0<br>1 | 0 0 0     0 1 | N/2 | 0 0 0     0 0<br>1 0 0     0 0 | 0<br>1 |
| 0<br>1 | 1 0 0     0 1 | N/2+1 | 0 1 0     0 0<br>1 1 0     0 0 | 2<br>3 |
| 0<br>1 | 0 1 0     0 1 | N/2+2 | 0 0 1     0 0<br>1 0 1     0 0 | 4<br>5 |
| $\vdots$ | $\vdots$ | $\vdots$ | $\vdots$ | $\vdots$ |
| 0<br>1 | 0 1 1     1 1 | N−2 | 0 0 1     1 1<br>1 0 1     1 1 | N−3<br>N−2 |
| 0<br>1 | 1 1 1     1 1 | N−1 | 0 1 1     1 1<br>1 1 1     1 1 | N−1<br>N |

FIG. 9A
FIG. 9B
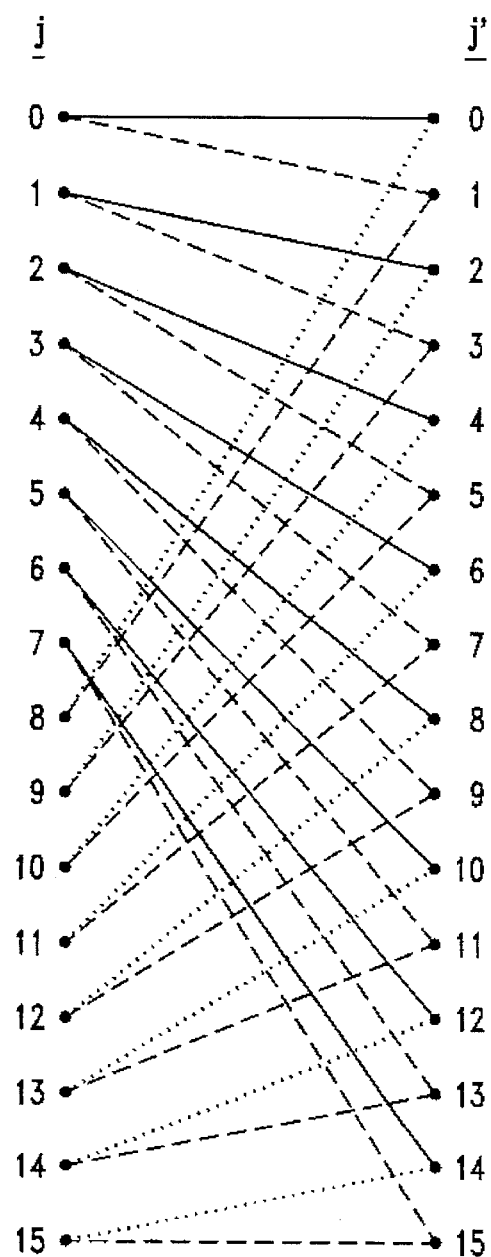
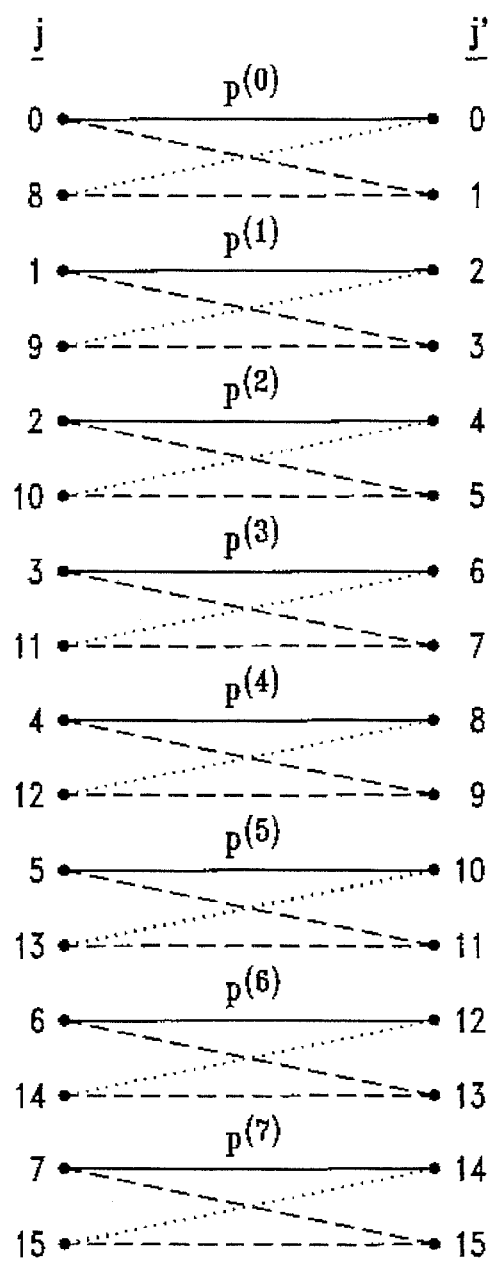

$j_u = 0, 1, ..., N/2-1 \qquad j'_0 = 2j_u$ $j_1 = j_u + N/2 \qquad j'_1 = j'_0 + 1$ $M(j'_0) = \max[M(j'_0, u), M(j'_0, l)] = \max[M(j_u) + p^{(j_u)}, M(j_1) - p^{(j_u)}]$ $M(j'_1) = \max[M(j'_1, u), M(j'_1, l)] = \max[M(j_u) - p^{(j_u)}, M(j_1) + p^{(j_u)}]$

FIG. 12

| K | $g^{(0)}$ | $g^{(1)}$ | RANK(H) | CONVENTIONAL DECODER | | NEW DECODER | |
|---|---|---|---|---|---|---|---|
| | | | | MULT. | ADD. | MULT. | ADD. |
| 3 | 5 | 7 | 1 | 16 | 16 | 0 | 10 |
| 4 | 64 | 74 | 2 | 32 | 32 | 0 | 20 |
| 5 | 46 | 72 | 2 | 64 | 64 | 0 | 36 |
| 6 | 65 | 57 | 2 | 128 | 128 | 0 | 68 |
| 7 | 554 | 744 | 2 | 256 | 256 | 0 | 132 |
| 8 | 712 | 476 | 2 | 512 | 512 | 0 | 260 |
| 9 | 561 | 753 | 2 | 1024 | 1024 | 0 | 516 |
| 10 | 4734 | 6624 | 2 | 2048 | 2048 | 0 | 1028 |
| 11 | 4672 | 7542 | 2 | 4096 | 4096 | 0 | 2052 |
| 12 | 4335 | 5723 | 2 | 8192 | 8192 | 0 | 4100 |
| 13 | 42554 | 77304 | 2 | 16384 | 16384 | 0 | 8196 |
| 14 | 43572 | 56246 | 2 | 32768 | 32768 | 0 | 16388 |
| 15 | 56721 | 61713 | 2 | 65536 | 65536 | 0 | 32772 |
| 16 | 447254 | 627324 | 2 | 131072 | 131072 | 0 | 65540 |
| 17 | 716502 | 514576 | 2 | 262144 | 262144 | 0 | 131076 |

FIG. 13

| K | $g^{(0)}$ | $g^{(1)}$ | $g^{(2)}$ | RANK(H) | CONVENTIONAL DECODER | | NEW DECODER | |
|---|---|---|---|---|---|---|---|---|
| | | | | | MULT. | ADD. | MULT. | ADD. |
| 3 | 5 | 7 | 7 | 1 | 24 | 24 | 0 | 10 |
| 4 | 54 | 64 | 74 | 2 | 48 | 48 | 0 | 20 |
| 5 | 52 | 66 | 76 | 2 | 96 | 96 | 0 | 36 |
| 6 | 47 | 53 | 75 | 3 | 192 | 192 | 0 | 72 |
| 7 | 554 | 624 | 764 | 3 | 384 | 384 | 0 | 136 |
| 8 | 452 | 662 | 756 | 3 | 768 | 768 | 0 | 264 |
| 9 | 557 | 663 | 711 | 3 | 1536 | 1536 | 0 | 520 |
| 10 | 4474 | 5724 | 7154 | 3 | 3072 | 3072 | 0 | 1032 |
| 11 | 4726 | 5562 | 6372 | 3 | 6144 | 6144 | 0 | 2056 |
| 12 | 4767 | 5723 | 6265 | 3 | 12288 | 12288 | 0 | 4104 |
| 13 | 42554 | 43364 | 77304 | 3 | 24576 | 24576 | 0 | 8200 |
| 14 | 43512 | 73542 | 76266 | 3 | 49152 | 49152 | 0 | 16392 |

FIG. 14

| K | $g^{(0)}$ | $g^{(1)}$ | $g^{(2)}$ | $g^{(3)}$ | RANK(H) | CONVENTIONAL DECODER | | NEW DECODER | |
|---|---|---|---|---|---|---|---|---|---|
| | | | | | | MULT. | ADD. | MULT. | ADD. |
| 3 | 5 | 7 | 7 | 7 | 1 | 32 | 32 | 0 | 10 |
| 4 | 54 | 64 | 64 | 74 | 2 | 64 | 64 | 0 | 20 |
| 5 | 52 | 56 | 66 | 76 | 3 | 128 | 128 | 0 | 40 |
| 6 | 53 | 67 | 71 | 75 | 4 | 256 | 256 | 0 | 80 |
| 7 | 564 | 564 | 634 | 714 | 3 | 512 | 512 | 0 | 136 |
| 8 | 472 | 572 | 626 | 736 | 4 | 1024 | 1024 | 0 | 272 |
| 9 | 463 | 535 | 733 | 745 | 4 | 2048 | 2048 | 0 | 528 |
| 10 | 4474 | 5724 | 7154 | 7254 | 4 | 4096 | 4096 | 0 | 1040 |
| 11 | 4656 | 4726 | 5562 | 6372 | 4 | 8192 | 8192 | 0 | 2064 |
| 12 | 4767 | 5723 | 6265 | 7455 | 4 | 16384 | 16384 | 0 | 4112 |
| 13 | 44624 | 52374 | 66754 | 73534 | 4 | 32768 | 32768 | 0 | 8208 |
| 14 | 42226 | 46372 | 73256 | 73276 | 4 | 65536 | 65536 | 0 | 16400 |

5,539,757

1

ERROR CORRECTION SYSTEMS WITH MODIFIED VITERBI DECODING

FIELD OF THE INVENTION

This invention relates to systems using coding and decoding of digital information for transmission over a communication channel, and to methods and means for such coding and decoding using convolutional codes.

BACKGROUND OF THE INVENTION

Channel coding efficiently introduces redundancy into a sequence of data symbols to promote the reliability of transmission. Two principal techniques employed are block and convolutional coding. See, for example, *Error Control Coding—Fundamentals and Applications* by S. Lin and D. J. Costello, Prentice-Hall, 1983.

Convolutional coding with Viterbi decoding is widely used as a forward-error-correction technique. Both because of the simplicity of its implementation and the relatively large coding gains that it can achieve. Such coding gains results principally from the ease with which this technique can utilize demodulator soft decisions and thereby provide approximately 2 dB more gain than the corresponding hard decision decoder.

One method of generating convolutional codes involves passing information sequences through shift registers and connecting the register stages to linear algebraic function generators. Selectively combining the outputs of the function generators produces the coded output sequence. A rate R=b/n convolutional code generates n output bits for every b input bits with K b-tuple stages in the encoding shift register. Generation of convolutional codes may also entail selecting codes from a look-up table.

Convolutional codes are a type of tree code. A tree code with no feedback is a trellis code. A linear trellis code is a convolutional code.

A. J. Viterbi introduced Viterbi decoding of convolutional codes in "Error Bounds for convolutional Codes and an Asymptotically Optimum Decoding Algorithm," *IEEE Trans. on Info. Theory*, Vol. IT-13, pp. 260–269, 1967. Viterbi decoding also appears in G D. Forney, Jr., "The Viterbi Algorithm" *Proceedings of the IEEE*, Vol. 16, pp. 268–278, 1973.

Forney in "Maximum Likelihood Sequence Estimation of Digital Sequences in the Presence of Intersymbol Interference," *IEEE Trans. on Info. Theory*, Vol. IT-18, pp. 363–378, 1972, also showed that Viterbi decoding involves maximum likelihood decoding for trellis codes and used it for equalizing channels with intersymbol interference. Viterbi decoding has also been used for demodulation of trellis-coded modulation. See, G. Ungerbock, "Channel Coding With Multilevel Phase Signals," *IEEE Trans. on Info. Theory*, Vol. IT-28, pp. 55–67, January 1982.

Thus, it can be seen that Viterbi decoding performs advantageously in decoding codes which can be generally characterized by a trellis-like structure.

Good results have been obtained with convolutional codes using soft demodulation outputs, and maximum likelihood decoding with Viterbi decoding (see the Lin and Costello reference, supra). Convolutional codes may be used for continuous data transmission, or by framing data into blocks.

2

Soft-decision decoding refers to the assignment at the receiver of one of the set of possible code sequences based on multiple-level quantized information at the output of the channel demodulator. Thus, for example, the received noise-corrupted signal from the channel is applied to a set of matched filters corresponding to each possible code word. The outputs of the matched filters are then compared and the code word corresponding to the largest matched filter output is selected as the received code word. "Largest" in this sense typically means largest as a function of samples corresponding to each bit in the received code word.

For a convolutional code with the constraint length K, there are $2^{(K-1)}=N$ states, and $2^K-2N$ state transition branches. In Viterbi decoding, the metric increment for each of these 2N branches needs to be computed at each decoding stage (for each decoded bit) in order to determine survivor paths and update accumulated metrics at the N states. Therefore, the complexity of the Viterbi decoder grows exponentially with the constraint length K. A soft-decision decoder with rate R=1/n requires $n2^K=2nN$ multiplications, 2nN additions and N comparisons at each decoding stage. This limits the efforts to increase coding gain by further increasing the constraint length.

An object of the invention is to improve communication systems. Another object of the invention is to simplify Viterbi decoding.

SUMMARY OF THE INVENTION

According to a feature of the invention, these objects are obtained in a communication system using a convolutional code by reading successive words from a channel, calculating selected metric increments for only N/2 states for each received word, comparing accumulative metrics and selecting survivors for two new states, and tracing back from a zero state.

These and other features of the invention are pointed out in the claims. Other objects and advantages of the invention will become evident from the following detailed description when read in light of the accompanying drawings.

BRIEF DESCRIPTION OF THE DRAWINGS

FIG. 6 is a table of state transition for convolutional code with a constraint length K.

FIG. 9A is a diagram showing state transitions for K=5 in a conventional Viterbi decoder.

FIG. 9B is a diagram showing companion states for K=5 in a modified Viterbi decoder embodying the invention.

FIGS. 12 to 14 are tables showing computational comparisons for Rate ½, ⅓, and ¼ convolutional codes.

DETAILED DESCRIPTION OF PREFERRED EMBODIMENTS

Figure 1:
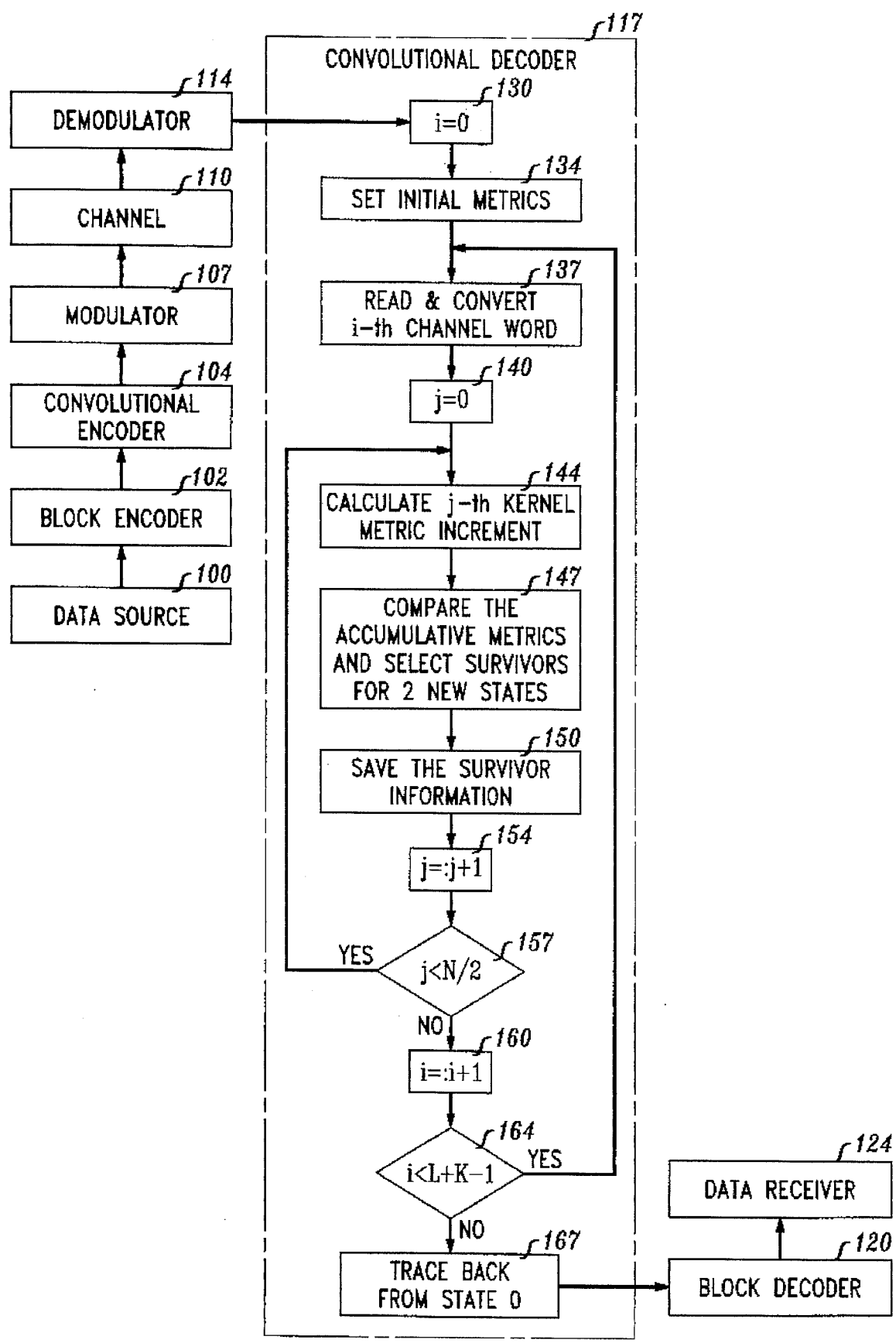
FIG. 1 is a communications system embodying features of the invention.

FIG. 1 illustrates a system embodying the invention and employing the modified Viterbi decoding according to an aspect of the invention. Here, a data source 100 passes the digital signals to an optional block encoder 102 which adds appropriate redundancy, such as parity check bits, to the output of the data source 100. The output of the block encoder 102 then passes to a convolutional encoder 104 which performs convolutional encoding. A modulator 107 modulates a carrier with the encoded signals from the convolutional encoder 104 and passes it to a transmission channel 110 that may exhibit noise and other distortions including fading. The data source 100, convolutional encoder 104, and modulator 107 are known in the art. The channel 110 is also a conventional type of channel.

A demodulator 114 receives the output of the channel 110 and performs standard demodulation in a manner complementary to the modulation of the modulator 107. A convolutional decoder 117 at the output of the demodulator 114 then passes the decoded signals to an optional block decoder 120 performs block decoding complementary to the block encoder 102. A data receiver 124 receives the decoded data. The convolutional decoder is in the form of a conventional Viterbi decoder modified to perform the steps of the invention.

The blocks inside the convolutional decoder 117 represent the steps performed by the convolutional decoder. Here in step 130, as in a standard Viterbi decoder, the start of an incoming word in a block of words is identified by setting an index i (where i may equal 0, 1, 2, ...) to 0. In the following step 134, the metrics of all N states of the code are initialized, with the metric at the 0 state higher than the remainder of the N states. This takes into account that the encoding process starts from the 0 state. The following step 137 entails reading and converting each of m+1 components of the i-th incoming input channel word into a given range. The next step 140 identifies a start point for a state by setting a state j (where j=0, 1, 2, ...) to 0. The steps 134, 137, and 140 are also those of a standard Viterbi decoder.

Thereafter, in step 144, the decoder 117 calculates the j-th metric increment on one selected branch, or kernel, it calculates the j-th kernel metric increment. This contrasts with the standard Viterbi decoding where the decoder calculates metric increments on two branches coming to the state j.

In step 147 the decoder 117 compares the accumulative metrics and select survivors for two new states. This differs from the standard Viterbi decoder which compares the two accumulative metrics and selects one survivor.

In step 150, the decoder 117 saves the survivor information for new states. This contrasts with standard Viterbi decoding which saves the single survivor for the new state.

In step 154 the decoder 117 increments j by one, and then in step 157 asks whether the value j is less than N/2, where N is the total number of states. If yes, the decoder 117 returns to step 144 and if no, the decoder proceeds the step 160. The step 157 contrasts with a standard Viterbi decoder in that the latter increments j to N instead of N/2 as in the invention.

The remaining steps 160, 164, and 167 are those of a standard Viterbi decoder. In step 160, the index i of incoming block of words is stepped by 1 to identify the next word. In step 164 the decoder 167 asks if the value of i is less than a block of L of words (or information bits) plus K-1 tail bits to produce L+K-1 code-words, where K is the memory constraint length of the convolutional code. In step 167, the decoder 117 traces back from the state 0 to pick one survivor path.

The operation of the decoder 117 can best be understood from consideration the following explanation of convolutional coding and Viterbi decoding.

Convolutional Encoder

Figure 2:
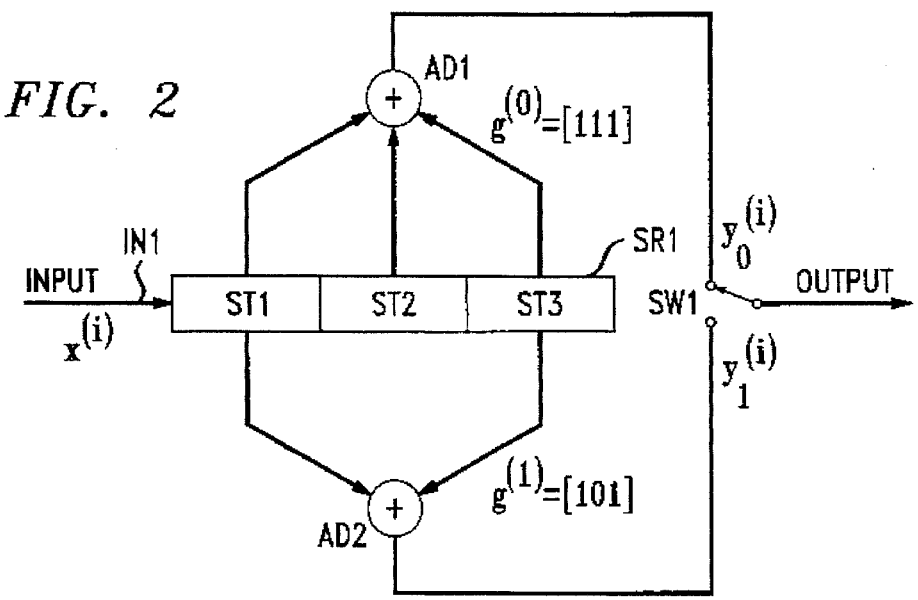
FIG. 2 is a block diagram of a convolutional encoder wherein R=½, and K=3.

FIG. 2 illustrates details of a convolutional encoder which, according to an embodiment of the invention, constitutes the conventional encoder 104. In general, three integers, n, b, and K define a convolutional decoder. A rate R=b/n convolutional coder generates n output bits for every b input bits. The integer K is a parameter known as the constraint length which represents the number of b-tuple stages in an encoding shift register that forms part of the convolutional encoder. Although its implementation applies to any code rate, for simplicity, only rate 1/n codes is considered at this point.

In FIG. 2, the convolutional encoder 204 receives, for example, a sequence of binary bits at its input IN1 from the block encoder 102. The convolutional encoder 204 may be of any form but is, according to one embodiment, shown as an R=½ convolutional encoder with the constraint length K=3 having shift register SR1 with a b=1 input IN1 and three stages ST1, ST2, and ST3. The constraint length K convolutional encoder uses a K-stage shift register SR1 and adds the outputs of selected stages in n modulo-2 adders AD1 and AD2 to form the encoded bits. The encoding process starts with all register stages ST1, ST2, and ST3 cleared. Information bits shift into the 3-stage shift register from the input IN1, and the content of each stage ST1, ST2, and ST3 shift to next stage on the right. (The content of the rightmost stage ST3 drops out.) For each information bit the two modulo-2 adders AD1 and AD2 output two bits to the channel, one from each. A switch SW1 serves as a multiplexer for the outputs of the adders AD1 and AD2.

The connections between the shift register stages ST1 and ST2 and the modulo-2 adders AD1 and AD2 are conventionally described by generator sequences. The generator sequences $g^{(0)}$=[111] and $g^{(1)}$=[101] represent the upper and lower connections, respectively, as shown in FIG. 2, where the leftmost components of the sequences represent the connections to the leftmost stage of the register SR1 holding the current input bit. At the end of the encoding, K−1= 2 zeros called tail bits are shifted into the register SR1 to flush the register and to ensure that the tail end of the input bit stream is shifted the full length out of the register.

The input bit and the contents of the K-1 left stages of the register before the input bit was shifted in uniquely determine the output bits at each encoding stage. These contents represent past K-1 input bits and represent the "state" of the convolutional coding system. Thus, a constraint length K convolutional code has $2^{(K-1)}$ states. The example shown in FIG. 2, produces 4 states: 00, 10, 01, and 11, where the left bit represents the leftmost stage.

Figure 3:
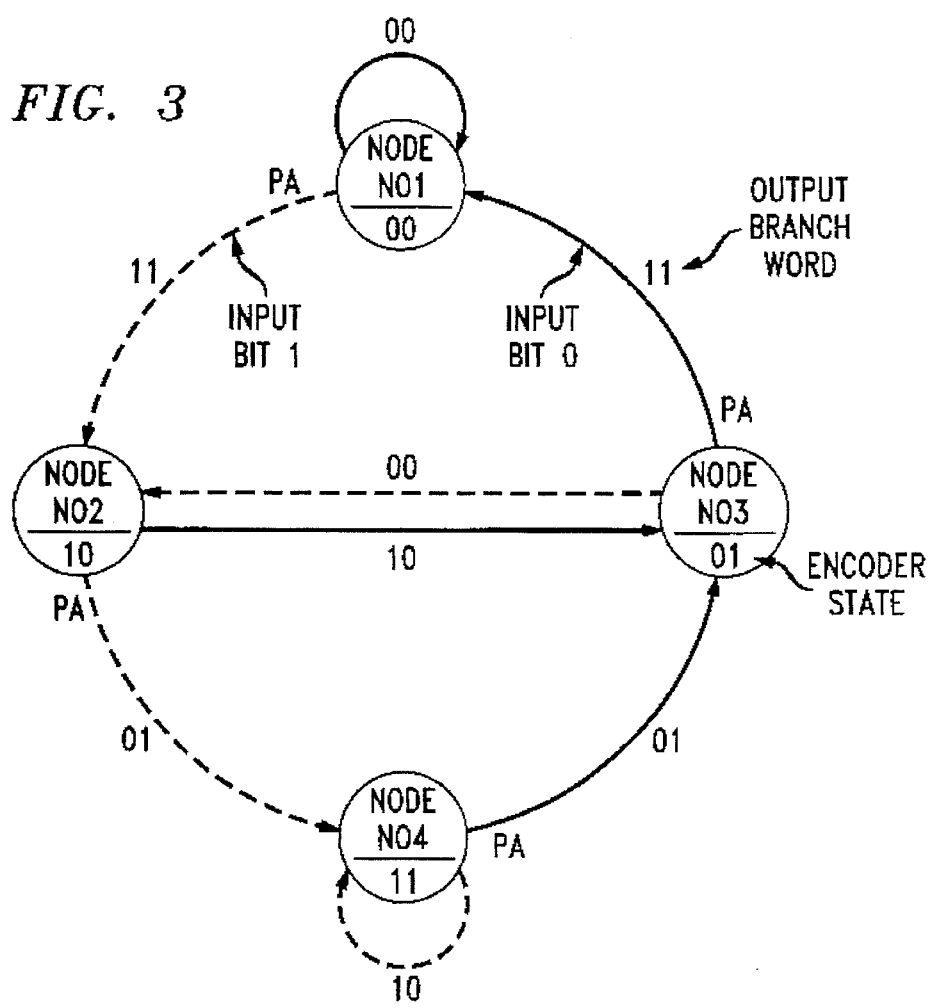
FIG. 3 is a state diagram of the encoder in FIG. 2, wherein R=½, and K=3.

A state diagram for FIG. 2 appears in FIG. 3 and illustrates all possible state transitions for the convolutional encoder 204 in FIG. 2. The states are labeled at the nodes NO1, NO2, NO3, and NO4 of the diagram. Only two transitions emanate from each state, corresponding to two possible input bits, and only two transitions merge to each state. Adjacent to each path PA (or a branch) between two states is a branch codeword of 2 output bits associated with the state transition. For convenience, code branches arising from a "0" input bit appear as solid (or dotted) lines and code branches arising from a "1" input bit appear dashed.

Figure 4:
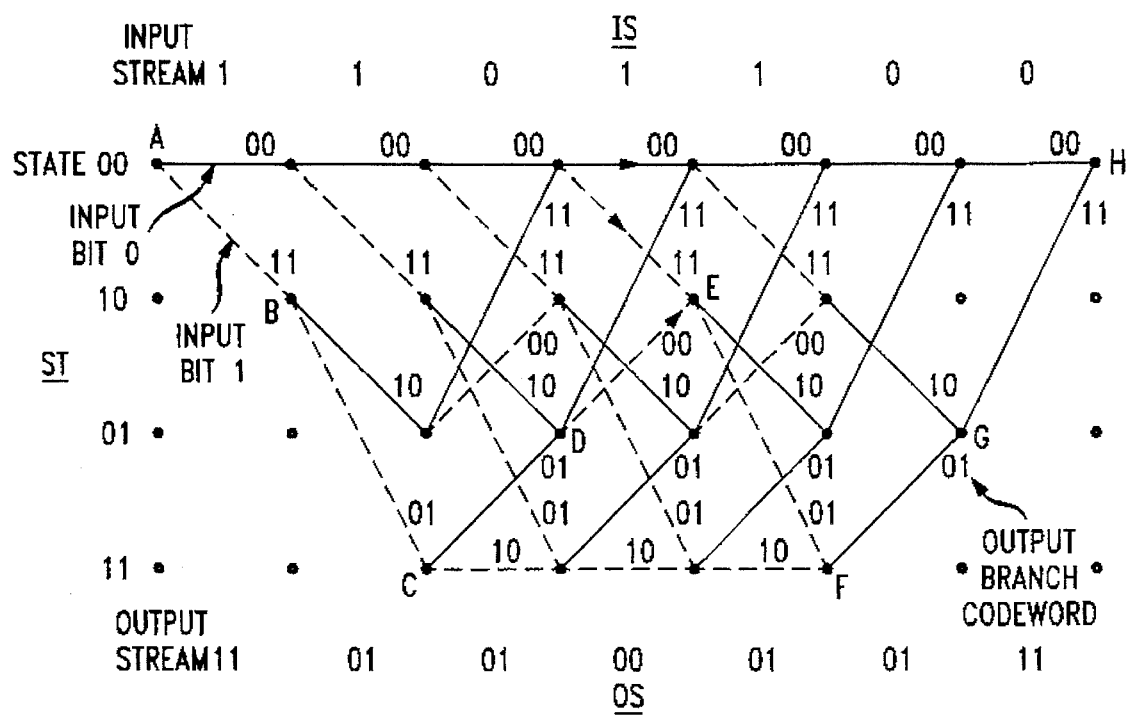
FIG. 4 is the convolutional encoder trellis diagram of FIG. 2 wherein R–½, and K=3.

Rearranging the state transition diagram and repeating the structure for each successive input bit leads to a trellis diagram representation of the convolutional encoder. This appears in FIG. 4 showing an input stream IS at the top and an output stream OS at the bottom. The states ST appear at the left. Since the encoding process starts from state 00 and ends at state 00 by shifting K-1 tail bits into the register, the trellis diagram does not reach all possible states at both ends. At any given state, the state transition follows the solid line for a "0" input bit and dashed line for a "1" input bit. The branch codeword appearing on the associated transition branch will output to the channel 110. For the example shown in FIG. 4, an input bit stream 1 1 0 1 1 plus 2 tail bits generates an output bit stream 1 1 0 1 0 1 0 0 0 1 0 1 1 1 which corresponds to the encoding path A-B-C-D-E-F-G-H.

Viterbi Decoding

Viterbi decoding utilizes the principles of a maximum likelihood decoder which computes the likelihood functions, or metrics, for each possible transmitted sequence, compares them and decides in favor of the maximum. If all information sequences to be encoded are equally likely, the maximum likelihood decoder will achieve a minimum block error probability.

Viterbi decoding with convolutional coding essentially performs maximum likelihood decoding. However, it reduces the computational load by taking advantage of the special structure in the trellis diagram of the convolutional code. FIG. 4 shows that the possible transmitted code branches remerge continually, and many non-maximum metric paths in the trellis diagram may be eliminated at the time they merge with other paths. It need only keep the surviving path that has maximum metric at each node. The accumulated metric of the survivor path at each node is preserved for comparison at the next decoding stage. This greatly reduces the complexity of the convolutional decoder.

Figure 5:
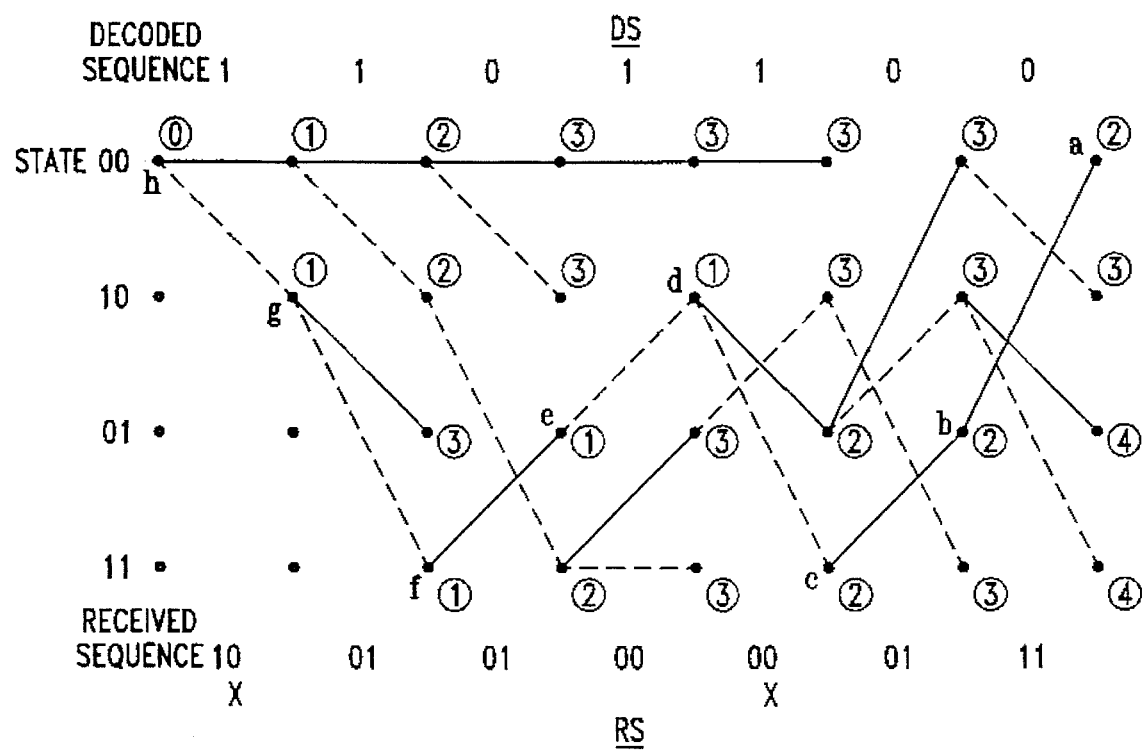
FIG. 5 is an example of convolutional decoding with a trellis diagram.

FIG. 5 is a trellis diagram of an example of convolutional decoding where R=½ and K=3. The received sequence of bits RS is at the bottom and the decoded sequence DS at the top. The states ST are at the left. FIG. 5 shows the Viterbi decoding of the channel sequence generated with the convolutional encoder shown in FIG. 4. Two bits were received in error as indicated with an "X" in FIG. 5. In this example, the metric of a path is equal to sum of the branch Hamming distances on the path. At each stage, the decoder computes the Hamming distance (the number of bits that differ) between the received channel word and each decoder branch word. Then the accumulated distance measure is updated at each node by comparing two candidate accumulated distances provided by two associated predecessor nodes and selecting the one with smaller distance measure. The surviving predecessor state information at each state is saved for later trace-back operation. This process continues until the end of the channel sequence has been reached.

Once the survivor path information is determined throughout the trellis, the maximum likelihood path can be derived by tracing back the trellis diagram from the zero state (00) at the end of trellis. The decoded bit at each stage is determined by the current trace-back state. For example, states 00 and 01 produce a decoded bit 0, and states 10 and 11 generate a decoded bit 1. The predecessor state information is then used to determine the predecessor state on the maximum likelihood path. This process repeats until the entire trellis is traced through (a-b-c-d-e-f-g-h) and complete decoded sequence (11011) is generated.

For large coding length, this may not be practical due to long decoding delay and huge amount of path memory. Therefore, sub-optimum decoding algorithms may be used, such as a memory truncation algorithm.

Soft-decision Decoding

In a typical communication system, the codeword sequence output from the channel encoder will be passed to a modulator, where the codewords are transformed into signal waveforms. At the receive side, a demodulator can be configured in a variety of ways. For the binary signal, it can be implemented to make a hard decision as to whether the demodulator output represents a 0 or 1. In the hard decision case, the output is quantized to two levels, 0 and 1, and fed into the decoder. The decoder then operates on the hard decisions made by the demodulator and therefore is called hard-decision decoder. Assume that all sequences are equally likely, then the optimum procedure in the hard-decision case is to pick the codeword sequence that differs from the received sequence in the smallest number of bit positions. That is, the maximum likelihood decision becomes the minimum distance decision.

The demodulator can also be configured to feed the decoder with a quantized value greater than two levels, so that the decoder will have more information than is provided in the hard-decision case. The decoder that operates on the multiple level decision made by the demodulator is called the soft-decision decoder. For a Gaussian channel, eight-level quantization results in a performance improvement of approximately 2 dB in required signal-to-noise ratio compared to two-level quantization. An important task is to define a suitable likelihood function for the decoder to utilize the soft decisions. It can be shown that for equally likely sequences, maximum likelihood decoder in the soft-decision case will make a decision minimizing the Euclidean distance between the possible codeword sequences and the received sequence.

Companion State Structure of the Trellis Diagram

For a convolutional code with the constraint length K, there are $2^{(K-1)}=N$ states, and $2^K$-2N state transition branches. In Viterbi decoding, the metric increment for each of these 2N branches needs to be computed at each decoding stage (for each decoded bit) in order to determine survivor paths and update accumulated metrics at the N states. Therefore, the complexity of the Viterbi decoder grows exponentially with the constraint length K. A soft-decision decoder with rate 1/n requires $n2^K$=2nN multiplications, 2nN additions and N comparisons at each decoding stage. This limits the efforts to increase coding gain by further increasing the constraint length.

For binary sources and coding systems, each of the n components of a branch word takes only two values, 0 and 1. Therefore, a rate 1/n code has at most $2^n$ distinct branch codewords. For a rate ½ code, only 4 codewords need to be considered. The same set of branch codewords will be duplicated for each decoding stage. This indicates that the decoder only needs to compare the received branch word with at most 4 distinct branch codewords at each stage and generate 4 metric increments in order to update the metrics for all $2^{k-1}$ states. In fact, the following shows that the number of actual distinct branch codewords may be less than $2^n$ for a general rate 1/n convolutional code.

Companion States and Kernel Branches

In a rate 1/n convolutional encoder with the constraint length K, let the contents of the register stages before the i-th input bit was shifted in be $s_0^{(i)}, s_1^{(i)}, \ldots s_{K-1}^{(i)}$, where $s_0^{(i)}$ is the content of the leftmost stage. Denote the n generator sequences of dimension K for the code as $$g^{(m)} = [g_0^{(m)} \; g_1^{(m)} \ldots g_{k-1}^{(m)}]$$

where m=0, 1, ..., n−1, $g_k^{(m)}$ is either 0 or 1 except that $g_0^{(m)}$ and $g_{K-1}^{(m)}$ are assumed to be 1. (m) Then for each input bit $x^{(i)}$, the encoded branch word is $$y_m^{(i)} = x^{(i)} g_0^{(m)} + s_0^{(i)} g_1^{(m)} + \ldots + s_{K-2}^{(i)} g_{K-1}^{(m)}$$

where $$y_m^{(i)} = x^{(i)} g_0^{(m)} + s_0^{(i)} g_1^{(m)} + \ldots + s_{K-2}^{(i)} g_{K-1}^{(m)}$$

and the modulo-2 addition is performed. Define a state number associated with the i-th input bit as $$j = s_0^{(i)} + s_1^{(i)} 2 + \ldots + s_{K-2}^{(i)} 2^{K-2}$$

The state number is a bit-reversed representation of the state:

| State | State # |
|-------|---------|
| 00...0 | 0 |
| 10...0 | 1 |
| 01...0 | 2 |
| . | |
| . | |
| . | |
| 11...0 | N−2 |
| 11...1 | N−1 |

Similarly, using j' to represent the state at stage i+1:

$$j' = s_0^{(i+1)} + s_1^{(i+1)} 2 + \ldots + s_{K-2}^{(i+1)} 2^{K-2}$$
$$= s_0^{(i+1)} + s_0^{(i)} 2 + \ldots + s_{K-3}^{(i)} 2^{K-2}$$
$$= s_0^{(i+1)} + 2j \bmod (2^{K-1}).$$

Figure 7:
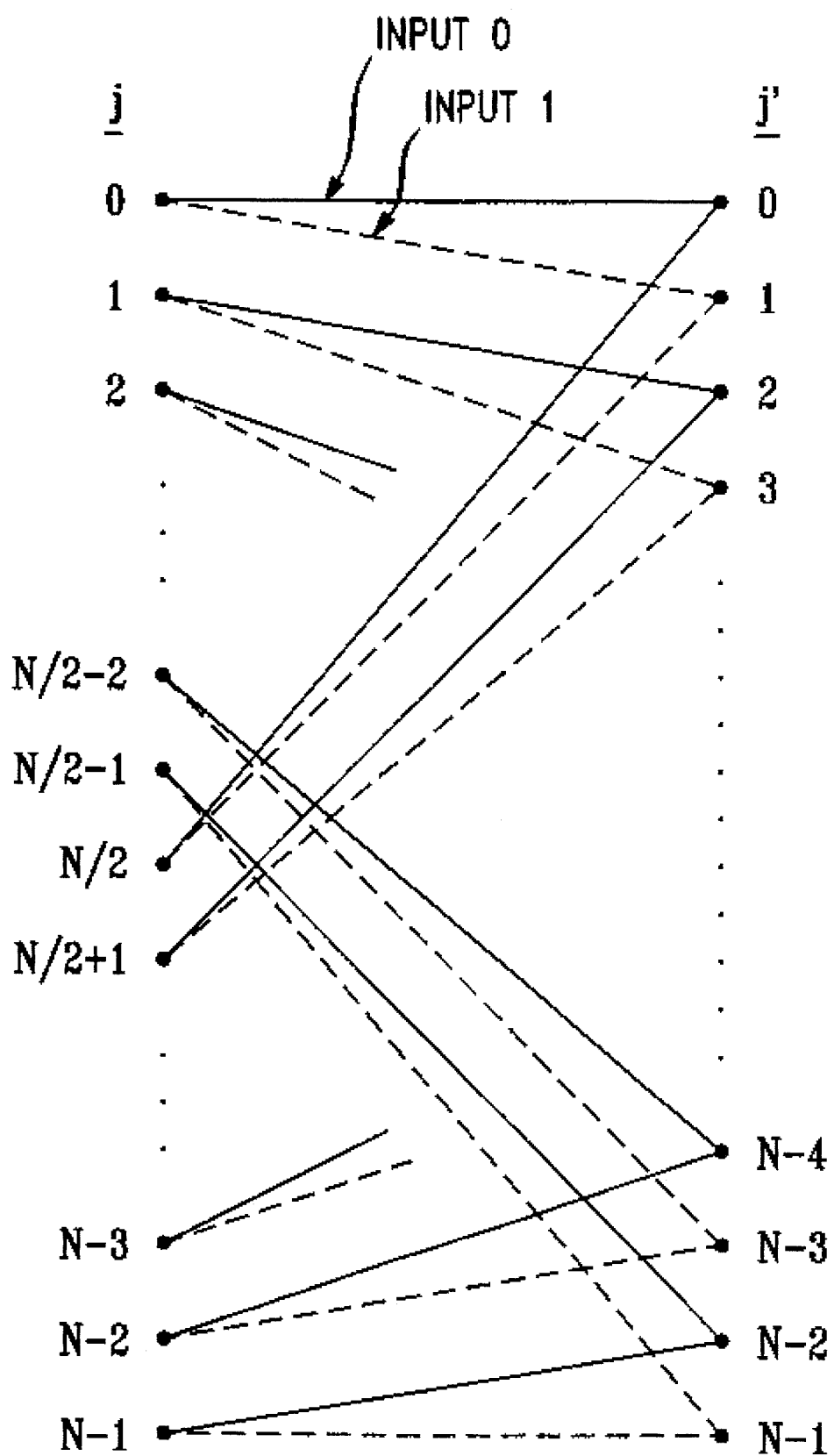
FIG. 7 is a trellis diagram of a rate 1/n convolutional code.

The state transitions for the rate 1/n convolutional code with the constraint length K are shown in the table of FIG. 6 and the corresponding trellis diagram is shown in FIG. 7. The terms state and state number are used interchangeably herein.

The state transition table of FIG. 6 and the trellis diagram of FIG. 7 show the following:

1. There are 2 transition branches emanating from each state.

The upper branch corresponds to an input 0 and the lower branch to an input 1.

Two terminating states transitioned from the same predecessor state j are $j'_0 = 2j \bmod N$ and $j'_1 = (2j \bmod N)+1$. Only the leftmost stage (the Least Significant Bit, or LSB) of these two new states are different and the K−2 high order stages are the same. Thus, $j'_1 = j'_0 + 1$.

Branch words on two branches emanating from the same state are complement to each other. That is, if a component of one branch word is 0, the same component of the other branch word will be 1 and vise versa. This is because these two output branch words are generated from the same state and complement input bit, 0 and 1.

2. There are always 2 branches merged to a new state j' from two predecessor states.

Both branches correspond to the same input bit value, either 0 or 1, depending on the parity of j'.

These two predecessor states have only the rightmost stage different. Upper branch is from the upper state $j_u = j'$ div 2 and the lower branch is from $j_l = j'$ div 2+ $N/2 = j_u +$ N/2, where div is the integer division.

Branch words on these two branches are complement to each other.

Figure 8:
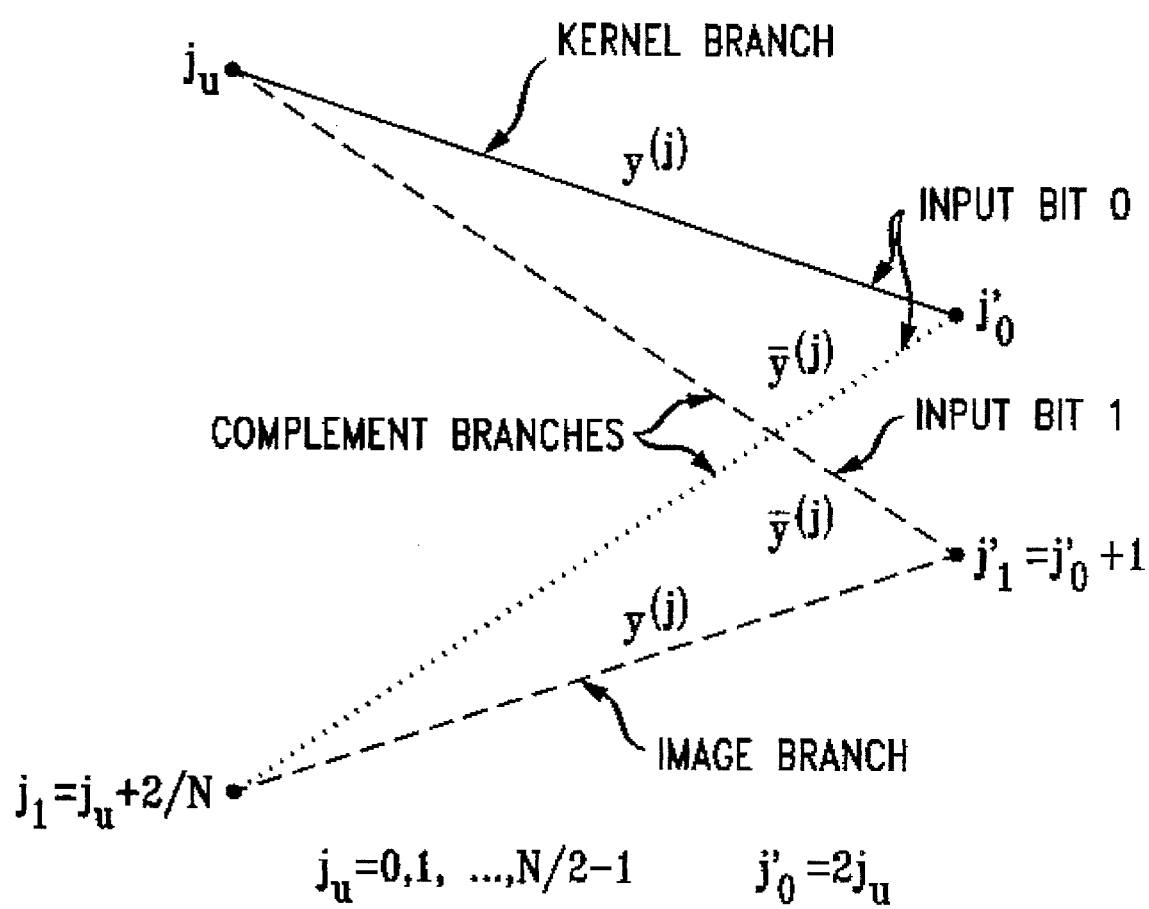
FIG. 8 is a diagram showing companion states and branches of a convolutional code.

3. There are a pair of emanating states always and only connecting to another pair of merging states as shown in FIG. 8.

Four branches emanating from state $j_u$ and $j_l = j_u + N/2$ always merge to a pair of new states $j'_0 = 2 j_u$ and $j'_1 = j'_0 + 1 = 2 j_u + 1$.

The merging state $j'_0 = 2 j_u$ is associated with the input 0, and the state $j'_1 = j'_0 + 1 = 2 j_u + 1$ is associated with the input 1. Notice that all states can be represented in terms of $j_u$, where $j_u = 0, 1, \ldots, N/2-1$.

$j_u, j_l, j'_0$ and $j'_1$ form a closed flow graph like a butterfly, no other states are connected to this graph.

The branch words on the branch connecting states $j_u$ and $j'_0$ and the branch connecting states $j_l$ and $j'_1$ are the same; the branch words on the branch connecting $j_u$ and $j'_1$ and the branch connecting $j_l$ and $j'_0$ are the same. These two pairs of branch words are complement to each other.

Thus, 2N branches at a decoding stage can be divided into N/2 so called companion groups of four branches. The 4 states (2 emanating states and 2 merging states) and 4 branches in each group are called companion states and companion branches. Since the branch words in each companion group are either the same or complement to the other, they can all be derived from one branch word. This branch is called the kernel branch of the companion group and it uniquely defines the codeword and metric increment structure of the group. Without loss of generality, we choose the branches connecting states $j_u$ and $j'_0 = 2 j_u, j_u = 0, 1, \ldots, N/2-1$ to be the kernel branches shown as solid lines in FIG. 8, and use $j_u$ as the kernel branch index, or called kernel state (node) number, which is one of the first N/2 state numbers. For convenience of the discussion, the branch with a branch word identical to that on the kernel branch in the same companion group is referred to as the image branch (shown as dotted lines) and the branches with complement branch words are referred to as complement branches as shown dashed in FIGS. 9A and 9B. FIG. 9A is a diagram showing state transition in a conventional Viterbi decoder and FIG. 9B is a diagram showing companion states for K=5 in a modified Viterbi decoder embodying the invention. Here, R=½, K=5, and N=16.

In the conventional Viterbi decoding of FIG. 9A, at each stage, a 2 bit channel word (a codeword possibly with added noise) is received and the metric increments on all 2N=32 branches are calculated. The metric increment on a branch indicates the likelihood of the associated codeword being transmitted at the stage given the received channel word. The accumulative metrics for 16 new states j' are obtained from these 32 metric increments j to j', and 16 old accumulative metric at old state. Since each new state is connected to two old states (one up and one down the trellis diagram), there are only two candidate accumulative metrics for the new state, each equal to the old accumulative metric at associated old state plus the metric increment on the associated branch. The minimum of two candidates is selected as the updated accumulative metric at the new state. for example at j'=0 the minimum is the line from j=0 and j=8, and at j'=1 the minimum is the line from j=0 and j=8. Thus 2N metric increments need be computed in the conventional Viterbi decoding scheme.

FIG. 9B is a restructure of the conventional trellis to the trellis according to an embodiment of the invention for one stage. This restructuring allows for simplification of the computation of the 2N metric increments. The state transitions and codewords associated with each branch are identical in both FIGS. 9A and 9B. The difference is that the drawing in FIG. 9B has N/2=8 groups, of 4 branches, which are non-intersecting. The symmetry of the four codewords within each group shows that only one metric increment, the so-called kernel metric increment in the group, needs to be computed. The remaining metric increments in each group are either the same or negative of the kernel metric increment. This allows simplification of the computation. Each group of four branches is called a companion group and the branch associated with the kernel metric increment is called the kernel branch in the group. For simplicity the branch connecting two lowest states in each group are chosen as kernel branches as shown by the solid lines in FIG. 9B. The kernel metric increments as well as the kernel branches and their associated companion groups are numbered 0,1, ... N/2–1.

It can be seen from table in FIG. 6 that for any kernel branch, both the associated input bit and the Most Significant Bit (MSB) of the state number are 0.

As stated, these N/2 companion groups (or butterflies) are mutually disjoint. That is, no branch connects two states in different companion groups. So, the trellis diagram is drawn in a non-intersected fashion with a different arrangement of the state numbers. FIG. 9B shows on the right rearranged emanating states for a convolutional code with K=5. Since each companion group is uniquely determined by its kernel branch, the entire code is uniquely defined by the N/2 kernel branches. This companion state and kernel branch structure of the convolutional code leads to a simplification of the coding and decoding process.

Kernel Generator Matrix

The properties of the rate 1/n convolutional code can be seen by defining G to be an nxK matrix composed of components of n generator sequences, $g^{(m)}$, m=0, 1, ..., n–1, of the code $$G = \begin{pmatrix} g^{(0)} \\ g^{(1)} \\ g^{(n-1)} \end{pmatrix} = \begin{pmatrix} g_0^{(0)} & g_1^{(0)} & g_2^{(0)} & \cdots & g_{K-2}^{(0)} & g_{K-1}^{(0)} \\ g_0^{(1)} & g_1^{(1)} & g_2^{(1)} & \cdots & g_{K-2}^{(1)} & g_{K-1}^{(1)} \\ g_0^{(n-1)} & g_1^{(n-1)} & g_2^{(n-1)} & \cdots & g_{K-2}^{(n-1)} & g_{K-1}^{(n-1)} \end{pmatrix}$$

Then a branch codeword can be expressed as $$y = [x\, s_0\, s_1\, s_{K-2}]\, G^T,$$

where T denotes matrix transpose. Since the corresponding input bit x and the MSB of the state, $s_{K-2}$, are both zero for kernel branches of the code, the first and last columns of G can be ignored when determining the kernel branch words. Denote the middle K–2 columns of G by an nx(K–2) matrix H:

$$H = \begin{pmatrix} g_1^{(0)} & g_2^{(0)} & \cdots & g_{K-2}^{(0)} \\ g_1^{(1)} & g_2^{(1)} & \cdots & g_{K-2}^{(1)} \\ g_1^{(n-1)} & g_2^{(n-1)} & \cdots & g_{K-2}^{(n-1)} \end{pmatrix} = (h^{(1)T}\, h^{(2)T} \ldots h^{(K-2)T})$$

where $$h^{(k)} = [g_k^{(0)}\, g_k^{(1)} \ldots g_k^{(n-1)}],$$

k=1, 2, ..., K–2, is an n-dimensional row vector and contains the k-th component of all n generator sequences. Thus, for a given state, the kernel branch word can be expressed as $$\begin{aligned} y &= [s_0\, s_1 \ldots s_{K-3}]\, H^T \\ &= [s_0\, s_1 \ldots s_{K-3}] \begin{bmatrix} h^{(1)} \\ h^{(2)} \\ \vdots \\ h^{(K-2)} \end{bmatrix}. \end{aligned}$$

The matrix H is called the kernel matrix of the convolutional code. Thus, any combination (modulo 2) of the K–2 vectors ($h^{(k)}$) is a kernel branch word. In other words, the kernel branch word space is spanned by K–2 row vectors $h^{(k)}$ k=1, 2, ... K–2. Notice that the dimension of the row space of $H^T$ (or column space of H) is equal to the rank of matrix H, denoted as v. Obviously, $$v = \text{Rank}(H) \leq \min(n, K-2)$$

Thus, the matrix HT has only v independent rows, $h^{(k)}$. The space spanned by these v vectors associated with the binary field (modulo-2 addition) will have only $2^v$ distinct vectors. Therefore, convolutional codes with Rank(H)=v will have only $2^v$ distinct kernel branch words.

For example, for a rate 1/3 convolutional code with K=5 and generator sequences:
$g^{(0)}$= [11011]
$g^{(1)}$= [ 10101]
$g^{(2)}$= [11111] ,
the associated kernel matrix is $$H = \begin{bmatrix} 1 & 0 & 1 \\ 0 & 1 & 0 \\ 1 & 1 & 1 \end{bmatrix}.$$

It can be seen that v= Rank(H)=2 in this case. So, there are only $2^2$= 4 distinct kernel branch words:
$y^{(0)}$= [000]
$y^{(1)}$= [101]
$y^{(2)}$= [011]
$y^{(3)}$= [101]
although there are 8 kernel branches (32 branches in total) in this code. It is interesting to see that v does not grow with K anymore when K–2>n.

Metric Updating and Computation of the Branch Metric Increments

To find a suitable metric for a soft-decision decoder to perform efficiently, the system uses the inner product of the received branch word z and the decoder branch codeword y of a rate 1/n convolutional code to be the metric increment on a branch:

$$p = \sum_{m=0}^{n-1} y_m z_m$$

Then the Euclidean distance between the entire received sequence and the codeword sequence will be equal to sum of the inner products of the received branch words and the decoder branch words in the sequences.

Before calculating the metric increments associated with the decoder branch words, we convert the components of the word received from the soft decision demodulator to a range of −V to V, if they are not yet in this range. The value V indicates a confident decision that the transmitted bit was 1, −V for a confident decision on 0. Any value in between indicates certain degree of confidence of the decision on 0 or 1. Likewise, we convert the components of the branch codewords on the decoding diagram from 0 to −1, and leave 1 unchanged. The inner product of the received branch words z and the decoder branch word y after the conversion can still be used as the metric increment for each decoding stage, although the components of the two words may be in different range. So, the metric increment can then be written as $$p = \sum_{m=0}^{n-1} y_m z_m = \sum_{m=0}^{n-1} \pm z_m$$

The maximum value of p, nV, indicates a confident decision that the codeword was the one transmitted, and the minimum value −nV indicates a confident decision that the codeword was not transmitted. We see that no multiplication is needed in this metric increment calculation. This is specially attractive when the decoder operates on multiple level decision made by the demodulator.

Figure 10:
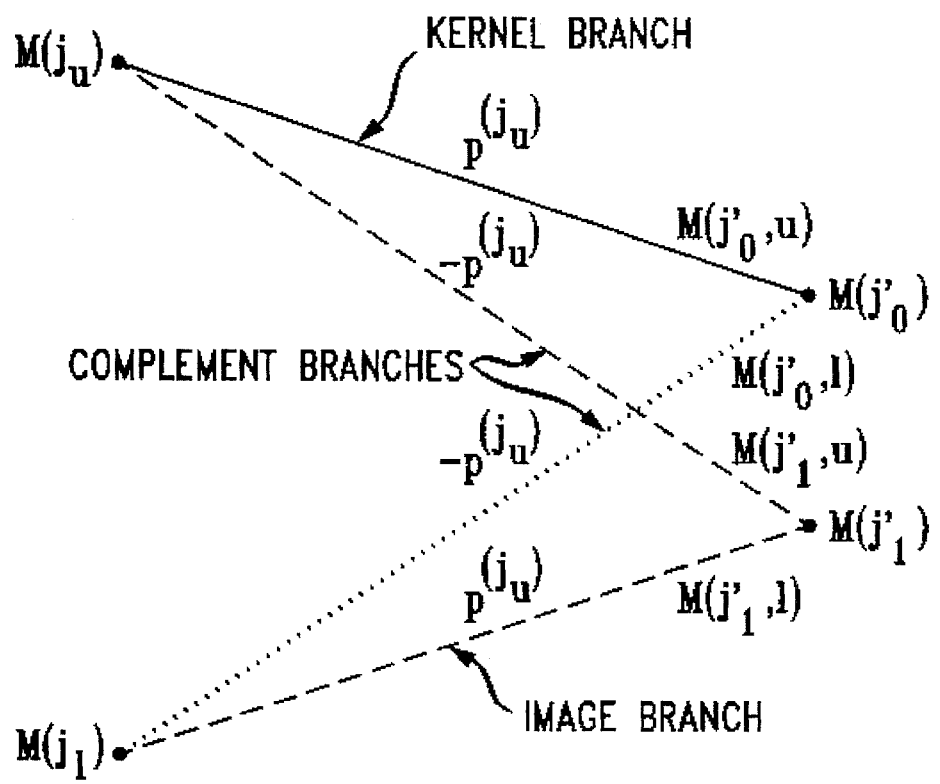
FIG. 10 is a diagram illustrating metric updating at companion states.

Once the metric increments for the kernel branches are calculated, the metric increments on all other branches can be derived. Other branch words in a companion group are either the same as or the complement of the kernel branch word as shown in FIG. 10. A component of the complement branch word will be −1 if the corresponding component of the kernel branch word is 1, and vise versa. So, if the metric increment on a kernel branch is p, then the metric increment on two complement branches in the same companion group will be −p. The metric increment on the image branch is always equal to that on the kernel branch, p. Thus, the metric updating operation for a companion group shown in FIG. 8 can be described in terms of a butterfly operation:

$M(j'_0) = \max [M(j_u) + p^{(i)}, M(j_l) - p^{(j)}]$ $M(j'_1) = \max [M(j_u) - p^{(i)}, M(j_l) + p^{(j)}].$ where $j_u$ is the kernel state number.

Figure 11:
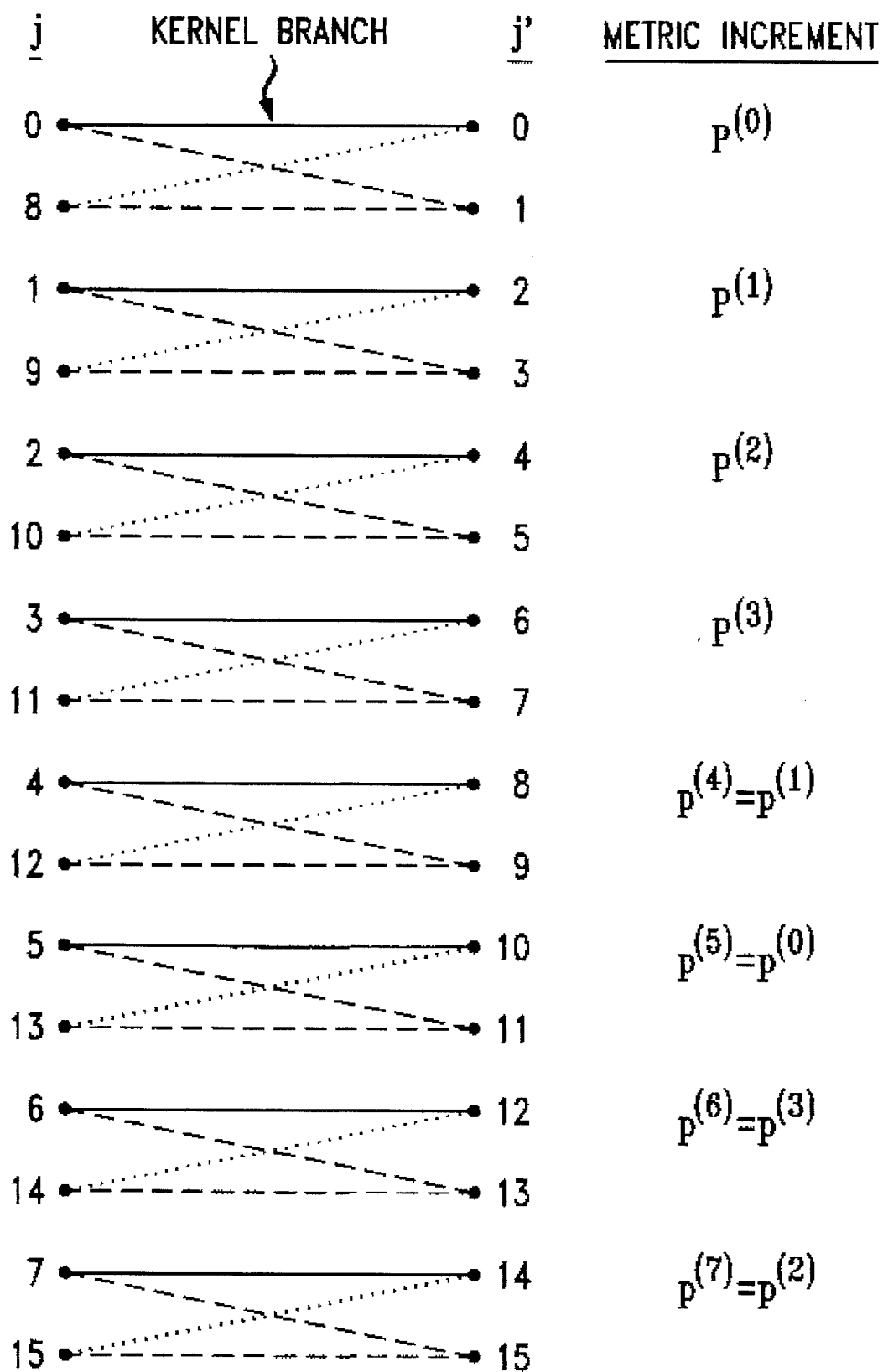
FIG. 11 is a diagram illustrating metric increments for kernel branches.

Once the metric increment for a kernel branch is determined, 4 additions and 2 comparisons are needed to update the metrics for each butterfly. Since there are N/2 such butterflies of the form of FIG. 10, a total of 2N additions and N comparisons are required to complete the metric updating at each stage after the metric increments are determined. Since we have only $2^v$ distinct kernel branch words, there are only $2^v$ distinct kernel metric increments to be calculated for each stage. Thus, the complete metric updating at each stage requires no multiplications, $2^v + 2N$ additions and N comparisons. For K-2>n, the number of metric computations (inner products) does not grow with the constraint length K. The kernel metric increments can be computed before the metric updating for any state starts. For the example with n=3, K=5 shown above, we have v=2; only 4 kernel metric increments need to be computed for updating all metrics at all N=16 states as shown in FIG. 11. The kernel state numbers of the companion groups sharing the same branch words can be shown to be {0,5}, {1,4}, {2,7} and {3,6}. In general, there are $2^{k-2}/2^v$ companion groups sharing the same kernel branch word and metric increment. The sharing structure depends on the generator sequences of a convolutional code.

In a soft decision decoder for a rate 1/n convolutional code with the constraint length K, there exists the following comparison in computing the metric updates at each decoding stage:

|  | Conventional Viterbi Decoder | Present Decoder |
|---|---|---|
| No. of Multiplications | 2nN | 0 |
| No. of Additions | 2nN | $2^v + 2N$ |
| No. of Comparisons | N | N |
| Metric Storage | 2N | N | where $N=2^{k-1}$ is the number of states, v is the rank of the kernel generator matrix H and v≦min (n, K-2). Tables in FIGS. 12 to 14 show the number of multiplications and additions required by the conventional decoder and our proposal for a set of best codes for rates R=½, ⅓ and ¼. These codes and their generator sequences are listed in aforementioned article "Error Bounds for convolutional Codes and an Asymptotically Optimum Decoding Algorithm," *IEEE Trans. on Info. Theory*, Vol. IT-13, pp. 260–269, 1967. The generator sequences are expressed in octal form.

Storage Arrangement for Metric and Survivor Path Information

Another significant task in implementing Viterbi decoding is to manage the storage for updating metrics at N states at each decoding stage. Because of the independent companion group structure of the trellis diagram, we see that no matter how the nodes in the diagram are rearranged it will always represent the same butterfly computation provided that the connections in each companion group are maintained. It should noted that the metric updating is only for determining the survivor path or the predecessor states on the survivor path which will be used in later trace-back operation to determine the decoded bits. So, the node (state) numbering is really not important as long as the predecessor state can be correctly derived in the trace-back operation to determine the maximum likelihood path and hence the correct decoded sequence.

Metric Updating Using Two Metric Buffers

In one example of the invention, N words are allocated to hold the accumulated metrics of survivor paths at N states before and after the metric updating at each stage. After the new metrics are computed and stored, the array of new metrics is duplicated to the old metric buffer for the metric updating at the next decoding stage. In order to avoid unnecessary data moving, the metrics in both buffers are stored in the same order regarding the associated state number so that only pointers to these buffers need to be exchanged. The reading of the old metrics and the generation of the new metrics are in different order shown in FIG. 11. According to embodiments of the invention, proper indexing is performed to ensure that the metrics for correct states are updated and stored. As seen from FIG. 11 there are two ways that the storage for the metrics can be arranged. One way is to store the metrics for N states in the natural order, 0, 1, ..., N-1, in both metric buffers. A pointer is managed so that the old metrics in the order of the state number j=0, N/2, 1, N/2+1, ..., N/2-1, N-1. The new metrics and the predecessor state information are generated and written in the natural order (from top to bottom), for new stages j'=0, 1, ..., N-1. This embodiment is more straightforward except that both index increment and decrement have to be employed in order to read appropriate old metrics.

For implementation on some Digital Signal Processors (DSPs), an alternative embodiment is faster. It is known that as long as the predecessor state information generated truly reflects the original decoding trellis structure, it doesn't matter in which order the metrics are actually stored. The second method is to store the metrics in order to state number 0, N/2, 1, N/2+1, ..., N/2-1, N-1 in both old and new metric buffers. Then the old metrics are read sequentially in the same order as stored, and a pointer is managed so that the resultant new metrics for state j'=0,1, ..., N-1 can be generated and written to the appropriate memory locations. Their location indices in the new metric buffer are 0,2, ..., N-2, 1, 3, ..., N-1 which can be obtained by incrementing by 2 each time and utilizing the modulo addressing at the end of the buffer. No explicit memory address decrement is needed.

Since the new metrics are always generated in the natural order in both cases, the predecessor state information can also be easily generated and stored in the natural order, 0, 1, 2, ..., N-1. This makes the trace-back operation very simple. In the binary case, there are only two branches merging to each state, only one bit is needed to represent the predecessor state information for each state. An N-bit word is required for each decoding stage to store this information. For example, for each trace-back state j' a bit 0 will be stored at the bit j' position of the word if the upper old state $j_u$ is the predecessor state, and a bit 1 stored for the lower old state $j_l$. Once the predecessor state information is generated, the trace-back procedure can be expressed as follows:

(1) Decoded input bit:
w=j' mod 2
(2) Predecessor state number:

$$j = \begin{cases} j' \text{ div } 2, & \text{if } q = 0 \\ (j' + N) \text{ div } 2 & \text{if } q = 1 \end{cases}$$

where q is the predecessor state information bit saved.

In-Place Metric Updating

Since two pairs of states in each companion group form a closed flow graph (not connecting to any states in other groups), the metric updating in each companion group is independent of other groups. In other words, the metrics at two old states are only used to compute the metric updates at two new states in the same companion group. This indicates that the memory locations for old metrics can be used to store the new metrics as soon as the metric updating for this group is complete. Assume that a memory location is always used to store the metric for either the upper or the lower state in the same companion group. As shown in FIG. 10, $M(j'_0)$ will be stored at location used for $M(j'_u)$, and $M(j'_1)$ will replace $M(j'_1)$. Thus, only one buffer is needed. This is called in-place computation.

Figure 15:
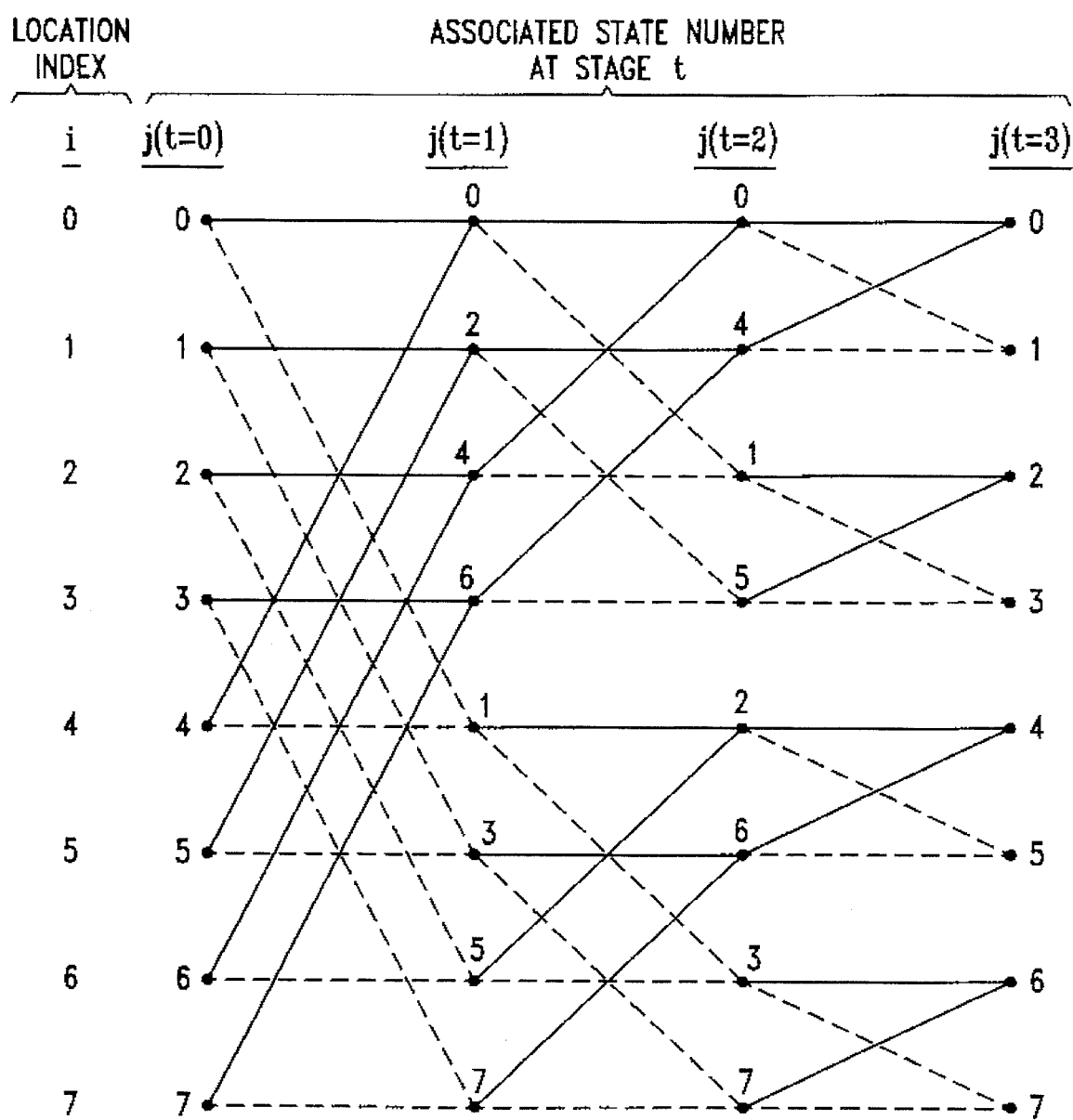
FIG. 15 is a diagram illustrating in-place metric updating for convolutional coding.

In general, the state number associated with each memory location is changed after storing back the new metrics. So, the states have to be regrouped again in updating metrics at next decoding stage. FIG. 15 shows how this process is carried out over the entire trellis for a convolutional code with the constraint length K=4. Only the associated state numbers for 3 decoding stages are shown. Assume the metrics at N initial states are stored in the natural order of the state number, i.e., the initial metric for state j, $M^{(0)}_{(j)}$, is stored at location i=j. After the metric updating at the first stage (t=1), the state number arrangement becomes j(t=1) 0, 2, ..., N-2, 1, 3, ..., N-1 as shown in FIG. 12. It is interesting to observe that after K-1=3 stages, the state number arrangement becomes the same as the initial order again. This process repeats until the end of decoding sequence.

In the in-place computation, the metrics on the same horizontal line in the flow graph of FIG. 15 are stored in the same memory location. In addition, the computation between two arrays of metrics consists of a butterfly computation in which the old metric nodes and new metric nodes are horizontally adjacent. The in-place computation require that the metrics must be stored and accessed in a nonsequential order.

Since the state numbering is not important in analyzing the metric updating we use the location index to discuss the metric updating procedure with the in-place computation. It should be noted that the whole decoding trellis diagram with the in-place computation can be divided into identical segments of K-1=3 substages as shown in FIG. 15. The substages is numbered t=1, 2 and 3, from left to right. So, the substage number will repeat the same sequence (1,2,3) until the end of the trellis. It is easy to show that the distance between the upper old metric node and the lower old metric node in each companion group at substage t is $D_t = 2^{K-1-t}$. It is equal to 4 (or N/2) for t=1, 2 for t=2, 1 for t=3 in this example. Then the in-place metric updating procedure can be described as follows:

For each substage t:
update the metrics for the companion group with the kernel index $$i = [2 u D_t + v, v = 0, \ldots, D_t-1]), u = 0, \ldots, 2^{t-1}-1],$$

where the inner loop index u changes faster than the outer loop index v. Suppose the predecessor state information is stored in the same order as the metrics at each substage. The trace-back operation can be expressed as follows:

For each substage t with the trace-back node index i':
decoded bit:
w= [i' div $D_t$] rood 2
predecessor
i= i'+$D_t$ (q−w),
where q is the predecessor state information bit saved.

According to an embodiment of the invention, the metric updating can also be computed in other orders. For example, if the kernel node is chosen in the order of:

$$i=[2 u D_t + v, u=0, \ldots, 2^{t-1}-1), v=0, \ldots, D_t-1]$$

then it is seen from FIG. 15 that the associated state number of the new metrics will be in the natural order, 0, 1, . . . , N-1. Thus, the predecessor state information is generated and stored in the natural order of the state number. Therefore, the same trace-back method described above concerning metric updating using two metric buffers is used and it reflects the original trellis diagram.

Since the metric updating in each companion group is independent of those in other groups, a parallel machine may be utilized to update the metrics for these companion groups at the same time. This will speed up the decoding algorithm significantly when v< K.

Figure 16:
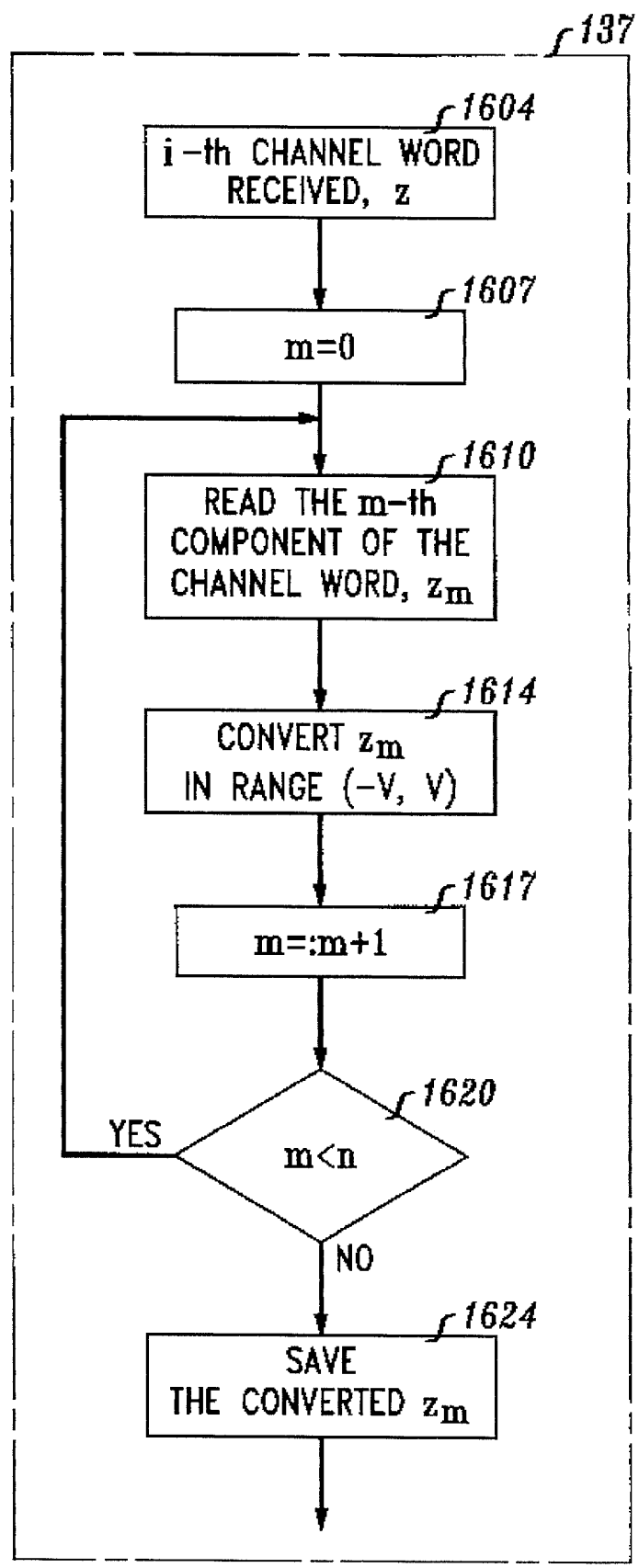
FIGS. 16, 17, and 18 are flow charts showing details of steps in FIG. 1.

FIG. 16 is a flow chart showing details for reading and conversion of the received channel word as shown in step 137 in FIG. 1. In step 1604 the i-th channel word is received and in step 1607 the index m (where m=0, 1, 2, . . . n-1) initialized to 0. In step 1610, the system reads the m-th component $z_m$ of the channel word z and in step 1614 converts $z_m$ in the range (–V, V). The index m is then incremented by 1 in step 1617. In step 1620, if m< n (the number of components in the channel word) the system returns to step 1610. If m is not smaller than n, the converted channel word z is saved in step 1624.

Figure 17:
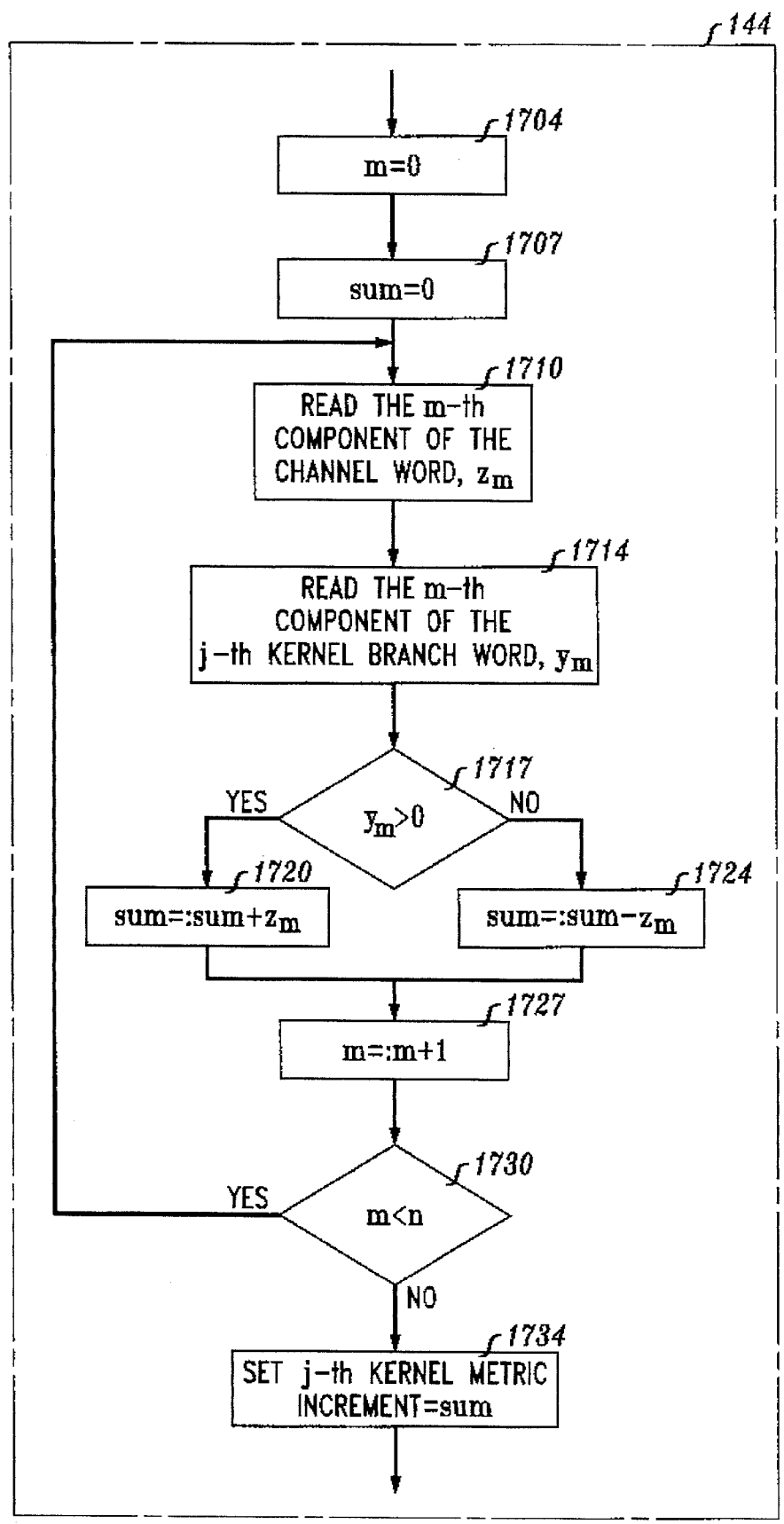

FIG. 17 is a flow chart of the block 144 in FIG. 1 for calculating the j-th kernel metric increment. Here, starting with the index m=0 in step 1704, and the sum=0 in step 1707, the m-th component $z_m$ of the channel word is read in step 1710. In step 1714, the m-th component of the j-th kernel branch word $y_m$ is read. In step 1717, if $y_m> 0$, the sum is incremented by $z_m$ as shown in step 1720, and if not the sum is incremented by $z_m$ as shown in step 1724. In step 1727, m is decremented by 1 and in step 1730, it is determined if m< n. If yes the process returns to step 1710, and if not goes on the step 1734. There, the j-th kernel metric increment is set equal to the sum.

Figure 18:
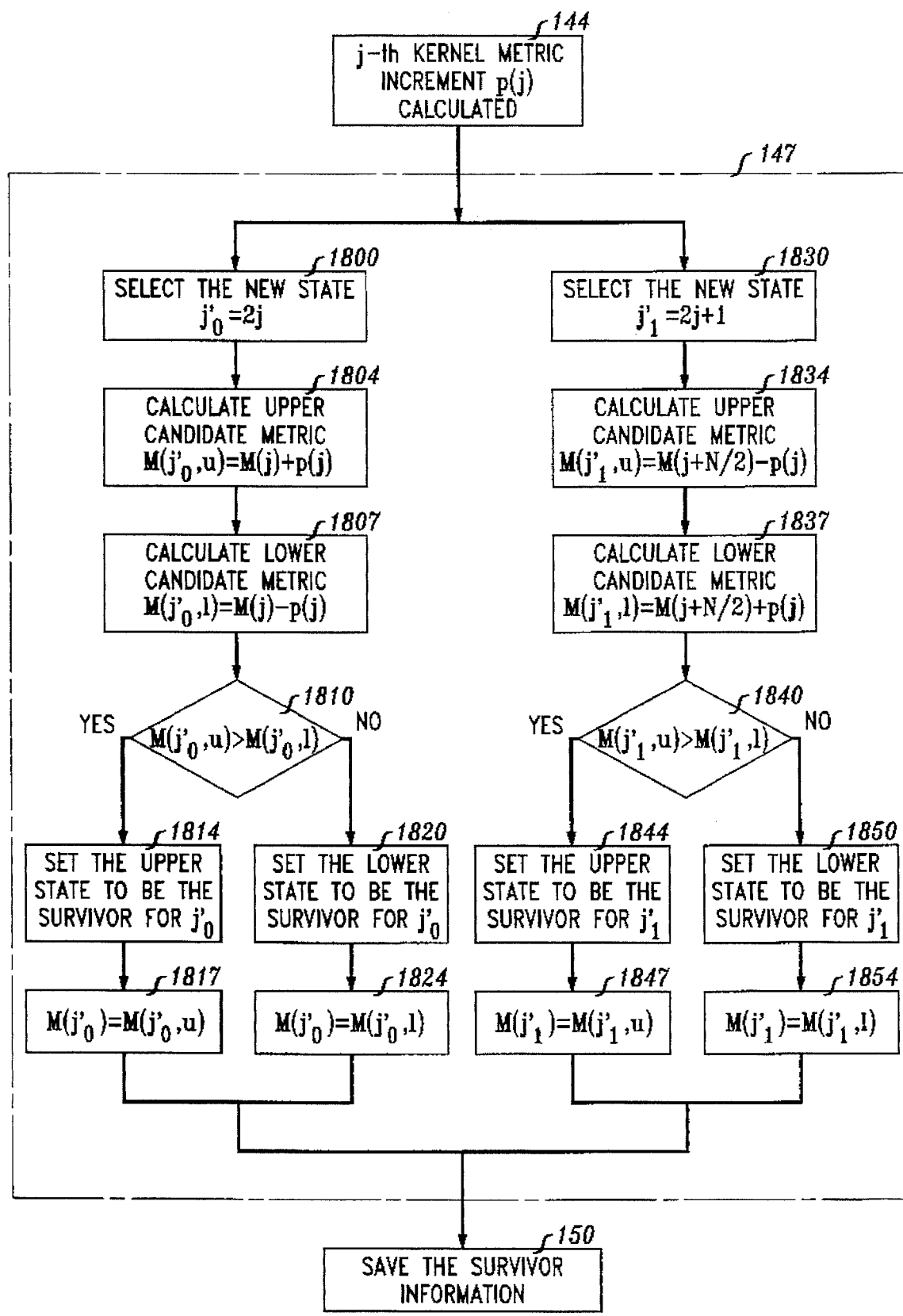

FIG. 18 is a flow chart which includes an example of the manner for comparing the accumulative metrics and selecting survivors for two new states as shown in step 147 in FIG. 1. Step 147 proceeds from step 144 in which the j-th kernel metric increment p(j) is calculated. Step 1800 involves selecting a new state j'= 2j. From there, step 1804 involves calculating the upper candidate metric $M(j'_0,u)=M(j)+p(j)$. Thereafter, step 1807 calculates the lower candidate metric $M(j'_0,l)= M(j)-p(j)$.

In step 1810, the system asks whether the value $M(j'_0,u)$ is greater than $M(j'_0,l)$. If the answer is yes, step 1814 indicates setting the upper state to be the survivor for $j'_0$. Then in step 1817, $M(j'_0)= M(j'_0,u)$. If the answer in step 1810 is no, then in step 1820 the lower state is set to be the survivor for $j'_0$, and in step 1824 $M(j'_0)= M(j'_0,l)$.

At the same time that steps 1800 to 1824 are being performed, the following steps occur. In step 1830, the system selects a new state $j'_1$ equal to 2j+1. From that the upper candidate metric $M(j'_1,u)=M(j+N/2)-p(j)$ is calculated In step 1837, the lower candidate metric is calculated such that $M(j'_1,l)= M(j+N/2)+ p(j)$. In step 1840, the determination is made if $M(j'_0,u)$ is greater than $M(j_1,l)$. If the answer is yes, the upper state is set to be the survivor for $j'_1$ in step 1844 Hence, in step 1847, $M(j'_1)=M(j'_1,u)$ If the answer is no, in step 1850, the lower state is set to be the survivor for $j'_1$. Hence, in step 1854, $M(j'_1)= M(j'_1,l)$.

Thus, depending upon whether the answers in step 1810 and step 1840 are yes or no, two of the results in steps 1817, 1824, 1847, and 1854 are saved in step 150 as the survivor information.

While the aforementioned steps show useful ways of implementing steps 137 to 150 in FIG. 1 other ways of realizing these effects are readily available to those skilled in the art.

The invention furnishes a convolutional coding structure which leads to a fast and economical implementation of the Viterbi decoding algorithm. This makes possible a convolutional code with a bigger constraint length in order to increase the coding gain.

While embodiments of the invention have been described in detail, it will be evident to those skilled in the art that the invention can be embodied otherwise without departing from its spirit and scope.

What is claimed is:

1. A communication system, comprising:

a channel;

a modulator at one end of the channel and a demodulator at the other end of the channel;

a convolutional encoder having a constant length K and $N=2^{(K-1)}$ states and responsive to a data source and coupled to the modulator;

a modified Viterbi decoder coupled to said demodulator;

said decoder including means for reading successive words from the demodulator;

said decoder including means for calculating kernel metric increments for only N/2 states;

said decoder including selector means for comparing accumulative metrics for each metric increment and selecting survivors for two new states; and tracing means in said decoder for tracing back from a zero state;

said calculating means being for calculating up to N/2 metrics.

2. A modified Viterbi decoder for decoding from a channel, encoded words in code having a constant length K and $N=2^{(K-1)}$ words, comprising:

means for reading words from the channel;

means for calculating kernel metric increments for only N/2 states;

selector means for comparing accumulative metrics for each metric increment and selecting survivors for two new states; and tracing means for tracing back from a zero state;

said calculating means being for calculating up to N/2 metric increments.

3. A method of processing information, comprising the following steps:

encoding data from a data source in a convolutional decoder;

modulating the encoded data;

passing the modulated and encoded data through a data channel;

demodulating the data from the channel;

decoding the demodulated data with a modified Viterbi decoder;

the decoding step including reading successive total of N states of successive words from the demodulator;

the decoding step further including calculating kernel metric increments for only N/2 metrics in said decoder;

said decoding step further including comparing metrics and selecting survivors for two new states; and tracing back from a first state.

4. A method of processing encoded data, comprising:

reading a successive total of N states of successive words in the data;

calculating kernel metric increments for only N/2 metrics in the words;

comparing metrics and selecting survivors for two new states; and tracing back from a first state.

* * * * *